(12) United States Patent
Brock

(10) Patent No.: US 6,484,589 B1
(45) Date of Patent: Nov. 26, 2002

(54) PIEZOELECTRIC TRANSDUCER ASSEMBLIES AND METHODS FOR THEIR USE

(75) Inventor: John L. Brock, Auburn, MI (US)

(73) Assignee: Senx Technology, Auburn, MI (US)

( * ) Notice: Subject to any disclaimer, the term of this patent is extended or adjusted under 35 U.S.C. 154(b) by 0 days.

(21) Appl. No.: 09/870,189

(22) Filed: May 30, 2001

(51) Int. Cl.⁷ .................................................. G01F 1/20
(52) U.S. Cl. ........................ 73/861.18; 73/168; 73/721; 73/866.5
(58) Field of Search ............................ 73/861.18, 866.5, 73/754, 721, 706, 707, 715, 727

(56) References Cited

U.S. PATENT DOCUMENTS

| | | | | |
|---|---|---|---|---|
| 4,823,602 A | * | 4/1989 | Christensen, Jr. ............ | 73/661 |
| 5,377,547 A | * | 1/1995 | Kusakabe et al. ............ | 73/723 |
| 5,402,683 A | * | 4/1995 | Kosugi et al. ................ | 73/756 |
| 5,629,486 A | * | 5/1997 | Viduya et al. ................ | 73/727 |
| 5,655,357 A | | 8/1997 | Kristen | |
| 5,847,282 A | * | 12/1998 | Keller ......................... | 73/706 |
| 6,070,469 A | * | 6/2000 | Taniguchi et al. ............ | 73/720 |
| 6,118,282 A | * | 9/2000 | Grieger ...................... | 324/637 |
| 6,176,137 B1 | * | 1/2001 | Sasaki et al. ................ | 73/754 |
| 6,186,009 B1 | * | 2/2001 | Miyano et al. ............... | 73/756 |
| 6,202,491 B1 | * | 3/2001 | McCarty et al. ............. | 73/659 |
| 6,255,728 B1 | * | 7/2001 | Nasiri et al. ................ | 257/704 |

* cited by examiner

Primary Examiner—Hezron Williams
Assistant Examiner—C D Garber
(74) Attorney, Agent, or Firm—Robert L. McKellar

(57) ABSTRACT

Piezoelectric transducer assemblies that are useful for the monitoring of the gas output from a gas driven pump, wherein the assembly is not an integral part of the input or output flow stream of the material being pumped, but is used to monitor the exhaust gas flow of the gas driven pump.

49 Claims, 8 Drawing Sheets

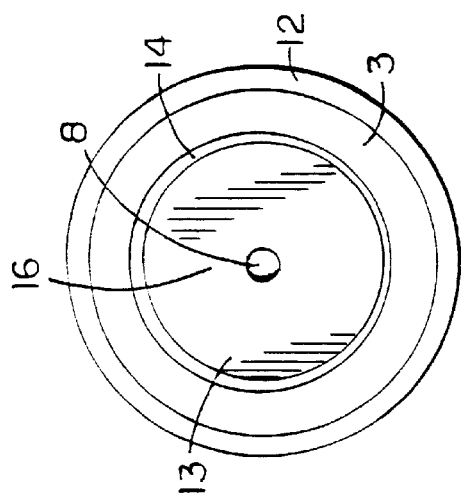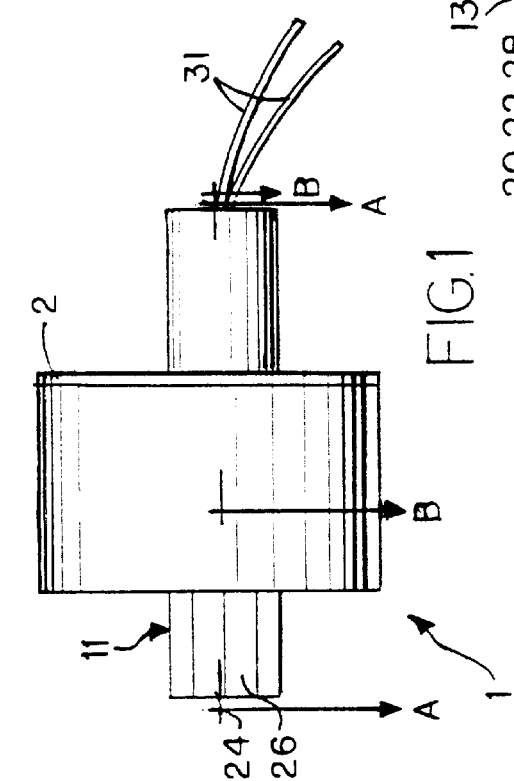

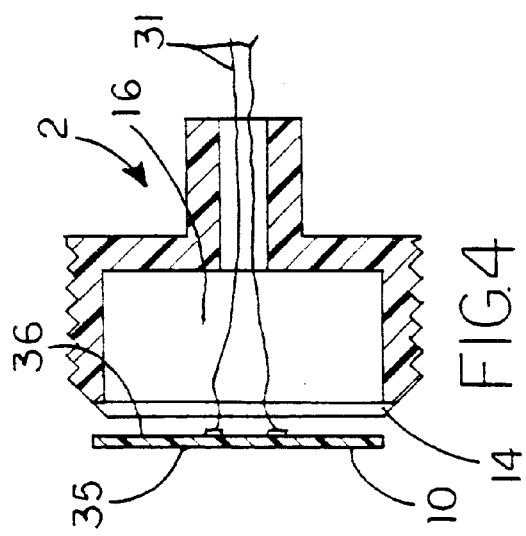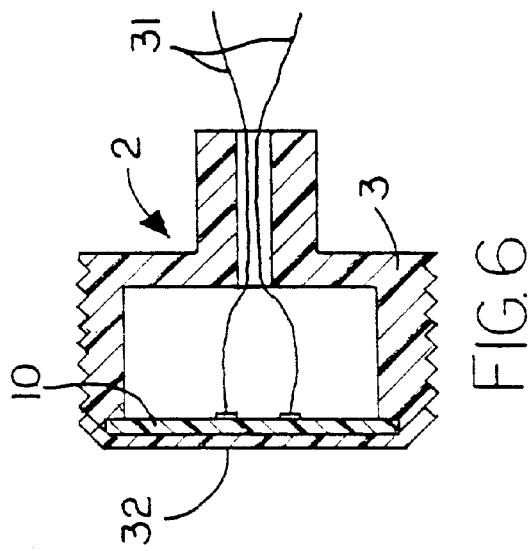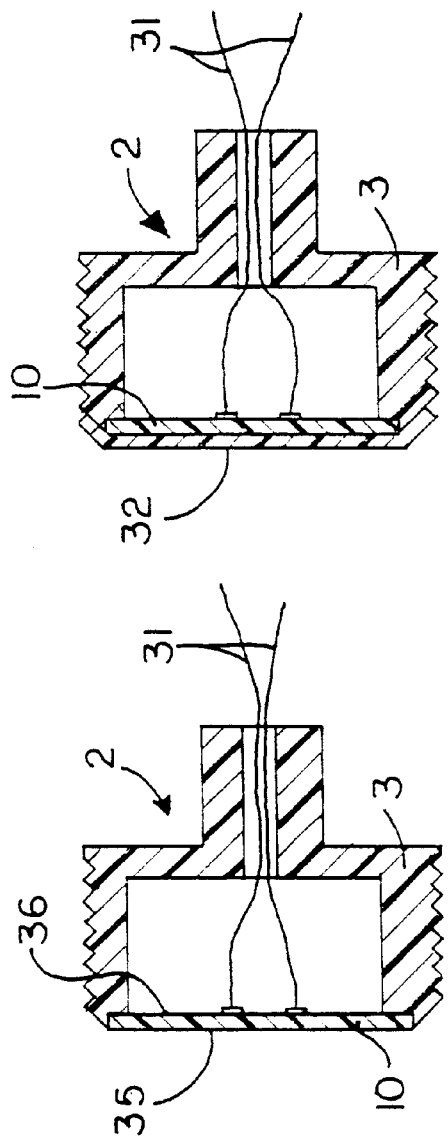

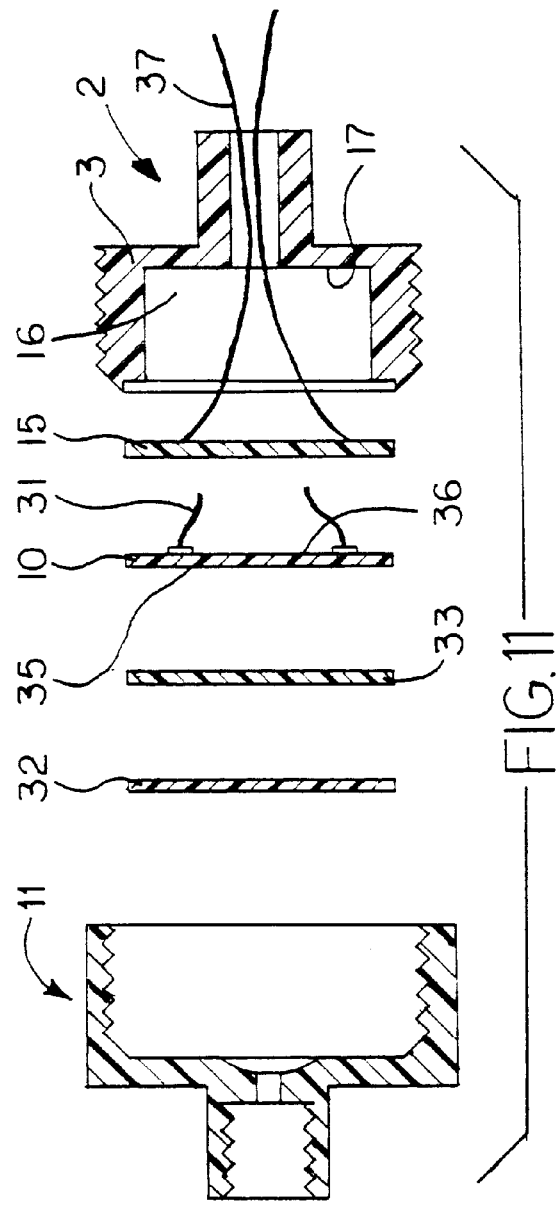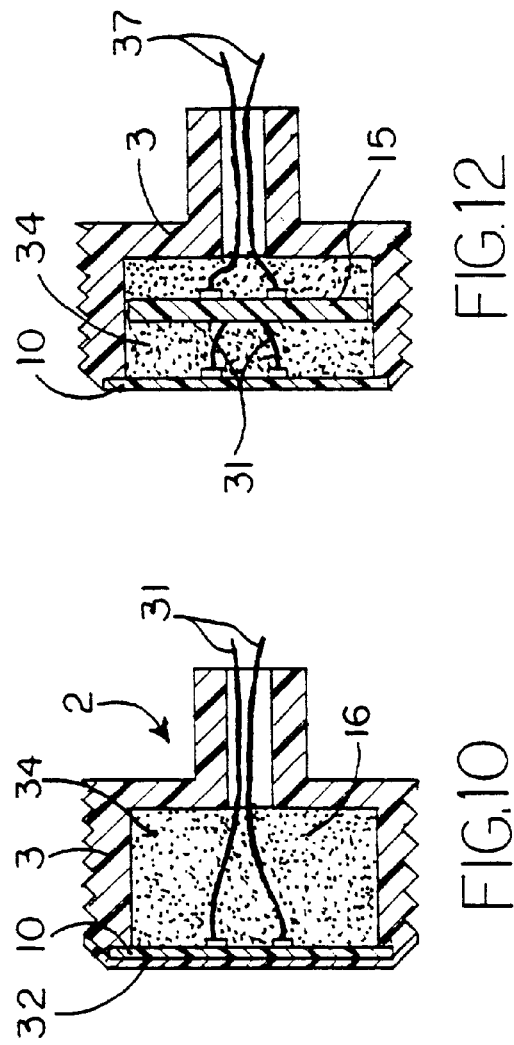

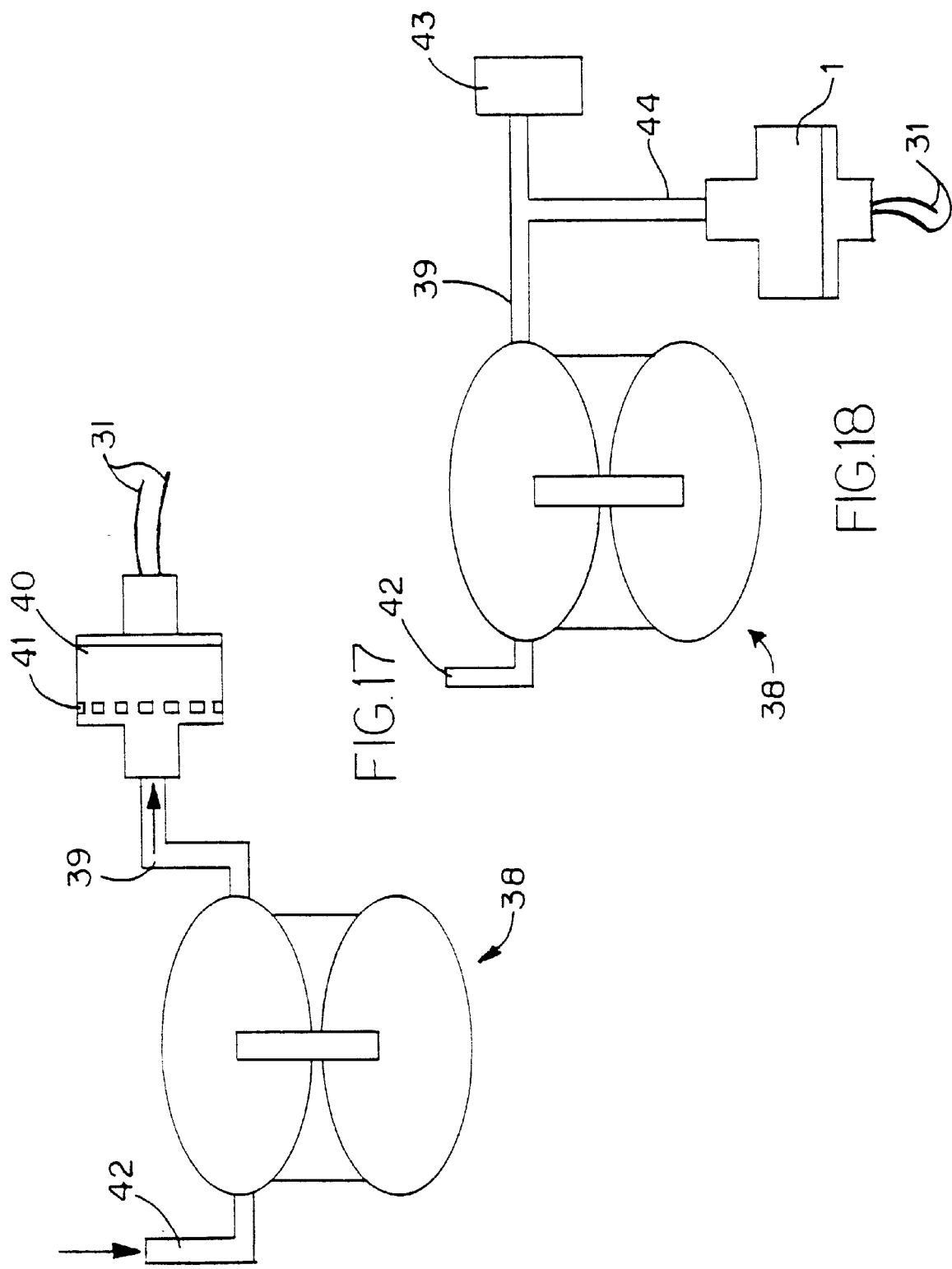

PIEZOELECTRIC TRANSDUCER ASSEMBLIES AND METHODS FOR THEIR USE

The invention disclosed and claimed herein deals with a piezoelectric transducer assemblies that are useful for the monitoring of the gas output from a diaphragm or bellows pump using air, nitrogen, or carbon dioxide as a working medium, wherein the transducer is not an integral part of the input or output flow stream of the material being pumped, but is used to sense the exhaust gas flow of the gas driven pump whereby the gas pump can be controlled. For purposes of this invention, what is meant by "gas pumps" herein is pulsed gas output pumps of the diaphragm or bellows type.

The transducers of the invention disclosed herein are intended to replace those transducers currently used in monitoring the input flow of material being pumped by a gas driven pump, the output flow of materials being pumped by a gas driven pump, and/or the pressure of the input or output flow of material being pumped by a gas driven pump. Such transducers are, for example, magnetic Hall effect transducers, Light Emitting Diodes or photo optic transducers, and the like.

In understanding the invention disclosed herein, one must remember that there are essentially, at minimum, two flow streams in a situation wherein material is being pumped by a gas driven pump. The first is the flow stream provided by the gas that is being used to drive the pump, and the second, or other streams, are those provided by the material being handled by the pump, such as water, non-toxic fluids, aqueous acids, aqueous caustics and other hazardous, toxic, and other pump destructive materials.

With the invention herein, when describing "low", it is meant that the discussion deals essentially with the flow of material being handled by the gas driven pump, and not the flow of gas being used to drive the gas driven pump, unless the gas flow stream is indicated otherwise.

BACKGROUND OF THE INVENTION

The use of piezoelectric transducers to measure, monitor and track various events is not new in the art. Currently, manufacturers are using magnetic Hall effect transducers, photo optic transducers, Light Emitting Diode transducers and the like to monitor gas pumps, or measure events taking place in manufacturing processes where gas pumps are utilized, wherein most pumps in use today are air driven pumps.

Some pressure sensing applications in which piezoelectric transducers have been used are: the actual measurement of pressure; measuring impact forces through the use of accelerometers; use of microphones for recording or detection of sound; the generation of sounds and/or ultrasonic waves; and, the detection of passing automobiles or trains over strings of transducers.

The gas driven pump industry has used electronic feedback from operating pumps in some critical applications for a number of years. The feedback has been carried out in a number of ways. Traditionally, in gas operated pumps, at least one part typically reciprocates. Some pump manufacturers use electronically shifting shuttle valves within or attached to these pumps. Such shifting has been accomplished by a reciprocating portion of the pump being detected with a proximity transducer, or by a color-contrasting portion of a reciprocating part in the pump passing an electronic eye, which in turn sends an electronic signal to a shuttle valve. This movement in turn shifts the shuttle valve.

Other pump manufacturers have used both mechanical and solid-state pressure switches, which receive a blast of gas from valves inside the pump at the desired time of shuttle valve switching. The mechanical or solid-state pressure switch then translates the blast of gas into an electronic signal that is then sent on to the shuttle valve for operation of the shuttle valve. In addition, the electronic signals that are sent to the shuttle valve can and have been tapped by manufacturers to provide electronic signals to other apparatii that monitor the pumps. These apparatii include but are not limited to: cycle counting transducers, tachometers, overrun monitors, underrun monitors and personal computer systems which are embedded in tools which monitor pumps, among other things.

In every case, the use of such current equipment requires invasive transducer placement in the pump itself. This creates a situation where the parts placed in the interior of the pump cause contamination, or the parts are affected by the caustic, acid, or other destructive chemicals being handled by the pump. Such parts include, for example, flow meters, mass transducers, and paddle wheel transducers, all of which are placed directly in the flow of the materials being handled by the pump. In the case of foods, such parts create situations wherein the food is contaminated by trace metals and other materials. Also, the placement of these parts in the interior of the pump creates a situation wherein the parts act as plugs or create plugs, or partial plugs, in the flow of the material being handled by the pump, and in addition, these parts are difficult to replace or repair.

In other situations, owing to the above stated problems, pump systems are not monitored at all and this leads to malfunctions in component parts of the manufacturing process and thus also leads to expensive downtime, cleanup and myriad other problems. In these situations, the only time that the pump is monitored is when there is a major malfunction that happens to be noticed by those monitoring the manufacturing process. The ultimate is when these problems cause the pump to stop completely, which often leads to human injury and equipment destruction.

Thus, it would be valuable to have a means of monitoring and/or controlling gas driven pumps by a non-invasive transducer that would essentially eliminate all of the above-mentioned problems.

THE INVENTION

What are disclosed and claimed herein are piezoelectric transducers that provide non-invasive means for monitoring the exhaust ports of gas driven pumps to eliminate the above-mentioned problems.

The methods disclosed and claimed herein use the transducers described just above in conjunction with digital output electronics, in which a great number of digital output electronic configuration are known in the prior art today, to provide a means for monitoring gas driven pumps. Such methods enhance the performance of the pumps and the control of the pumps without the concomitant problems associated with transducers that are required to be inserted in the pumps per se. The transducers of this invention can be mounted as part of a gas diffuser, or can be remotely located, even at relatively long distances from the pump, such as, for example, when that pump is handling an explosive material.

The transducer assemblies of this invention, and the methods of this invention provide a plurality of benefits not obtainable by the transducers and methods of the prior art, such as the ability to keep all parts out of the gas pump, and especially metal parts from the diaphragm and/or bellows of the pump; ability to handle high end acid materials or caustic materials without destruction of the transducers; ability to start and stop gas pumps very quickly owing to the instantaneous response by the transducer to air flow events; allow precise monitoring and control of flow rates and metering applications; have the ability to verify priming of the gas pump and initiation of a restart of any operation, or any sequence of operation; they provide quick and easy retrofit to older or existing equipment; they can verify that the gas pump is actually operating; they have the capability of constant flow rate monitoring; they have the ability to shut down pumps on certain specified deviations from standards; they can control precise metering of fluids such as gallons, quarts, liters, ounces, or larger or smaller quantities, and, their use generally leads to more efficient and more reliable gas pump designs.

Thus, what is disclosed and claimed herein in one embodiment is a piezoelectric transducer assembly comprising in combination, an insertable transducer retainer assembly and a receiving transducer retainer assembly, the insertable transducer retainer assembly comprises a housing having an outside surface, a front and a back. The back has centered in it, a hub. The centered hub has a centered opening through it and the centered hub is integrally connected to the insertable transducer retainer assembly. The outside surface has a fastening means on it and a tapered front outside circumferential edge.

The insertable transducer retainer assembly has a first circular opening in the front, wherein the first circular opening has a circular piezoelectric transducer disposed in it. The piezoelectric transducer has a bottom surface and a top surface.

There is a second opening in the front of the insertable transducer retainer assembly, deeper than the first circular opening and having a lesser diameter than the diameter of the first circular opening.

The centered opening in the centered hub continues on through the transducer retainer assembly housing and opens into the second opening to provide a continuous channel through the transducer retainer assembly, which exits at the back of the hub. The piezoelectric transducer has electrical leads connected to its bottom surface.

The receiving transducer retainer assembly also has a housing. The receiving transducer retainer assembly housing has a front and a back, wherein the back has centered in it a hub integrally mounted on it. The receiving transducer retainer hub has a back and a front and is lesser in diameter than the diameter of the receiving transducer retainer assembly housing.

The front of the receiving transducer retainer assembly has located therein an opening. The receiving transducer retainer assembly opening has an interior surface and a bottom, wherein the interior surface has disposed on it, a fastening means compatible with the fastening means of the insertable transducer retainer assembly. The opening has a tapered circumferential edge at the bottom. There is a saucer-like depression below the bottom of the opening in the receiving transducer retainer assembly. The saucer-like depression has a bottom. The surface area of the top of the saucer-like depression is relative to the surface area of the top of the piezoelectric transducer, the surface area relationship having a ratio in the range of from zero to 1:1.

There is a channeled opening from the bottom of the saucer-like depression through the center of the receiving transducer retainer hub and the interior of the receiving transducer retainer hub has an adapting means for adapting the receiving transducer retainer assembly to a pump. The pump in this case is a gas pump, either of the bellows type air pump, or the diaphragm type air pump.

In a further embodiment of this invention, in the piezoelectric transducer, there is disposed over the top of the piezoelectric transducer, an elastomeric protective covering, typically in the form of a disk, the details of which are set forth infra.

In yet another embodiment of this invention, there is further disposed in the bottom of the second opening of the transducer retainer assembly, an electronic configuration, the details of which are provided infra.

In still another embodiment of this invention, there is disposed in the second opening a compressible material, the details of which are provided infra.

In addition, there is an embodiment of this invention in which there is provided at least one stiffening disk covering the piezoelectric transducer per se, the details of which are also provided infra.

In still another embodiment of this invention, there is set forth a system comprising an gas pump, a piezoelectric transducer assembly operably associated with the gas pump, and a control system for monitoring and controlling the gas pump.

BRIEF DESCRIPTION OF THE DRAWINGS

FIG. 1 is a full side view of one embodiment of a piezoelectric transducer assembly of this invention.

FIG. 2 is a cross sectional view of the piezoelectric transducer assembly of this invention taken through line A—A of FIG. 1, and exploded, the internal parts of the transducer being excluded in this FIG. to provide clarity to the figure.

FIG. 3 is a front end view of the insertable transducer retainer assembly of this invention sewing the various openings therein.

FIG. 4 is a cross sectional full side view of the insertable transducer retainer assembly of this invention taken through line B—B of FIG. 1, showing a piezoelectric transducer suspended above the openings in the insertable transducer retainer assembly.

FIG. 5 is a cross sectional full side view of the insertable transducer retainer assembly of this invention taken through line B—B of FIG. 1, showing the piezoelectric transducer in place in the first opening and resting on a shelf.

FIG. 6 is a cross sectional full side view of the insertable transducer retainer assembly of this invention taken through line B—B of FIG. 1, showing the piezoelectric transducer in place in the first opening and covered with a protective covering.

FIG. 10 is a cross sectional full side view of the insertable transducer retainer of this invention taken through line B—B of FIG. 1, showing a protective covering over the piezoelectric transducer, and a compressible material disposed in the second opening FIG. 11 is an exploded cross sectional full side view of the piezoelectric transducer assembly of this invention taken through line A—A showing an electronic configuration surmounted by a piezoelectric transducer, which is surmounted by a stiffener disk, which is surmounted by a protective disk.

FIG. 12 is a cross sectional full side view of the insertable transducer retainer of this invention taken through line B—B of FIG. 1, showing an electronic configuration encapsulated if the compressible material disposed in the second opening.

FIG. 17 is a schematic view of a combination of a gas pump and the piezoelectric transducer assembly gas diffuser of FIG. 15, in which the piezoelectric transducer assembly gas diffuser is attached directly to the exhaust gas stream of the gas pump.

FIG. 18 is a schematic view of a combination of a gas pump and a piezoelectric transducer assembly of this invention that is attached indirectly to the exhaust gas stream of the gas pump.

DETAILED DESCRIPTION OF THE INVENTION

Figure 9:
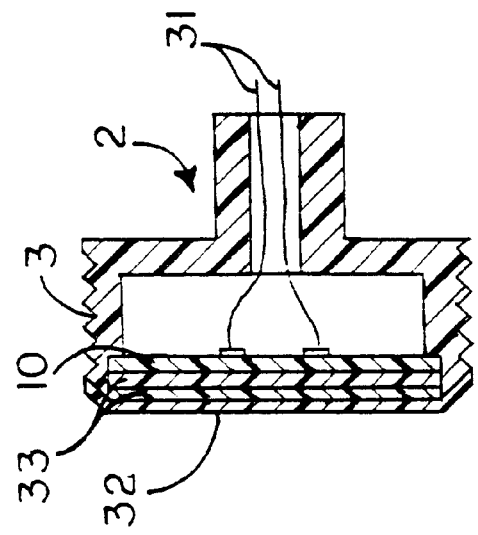
FIG. 9 is a cross sectional full side view of the insertable transducer retainer of this invention taken through line B—B of FIG. 1, showing a first stiffener disk surmounting the piezoelectric transducer, a second stiffener disk surmounting the first stiffener disk, and a protective covering surmounting the second stiffener disk.

Turning now to the Figures, and with regard to FIGS. 1 and 2, there is shown a full side view of a piezoelectric transducer assembly 1 of this invention. The piezoelectric transducer assembly 1 is comprised of two segments, a receivable transducer retainer assembly 11 and an insertable transducer retainer assembly 2, said insertable transducer retainer assembly 2 being comprised of a housing 3, having an outside surface 4, a front 5, and a back 6. The back 6 has centered in it, a hub 7, the centered hub 7 having a centered opening 8 through the hub back 9 to accommodate wire leads 31 from a piezoelectric transducer 10, (shown in FIGS. 1 and 4), or an electronic configuration 15, shown in FIG. 11. The essence of the electronic configuration 15 will be discussed infra. The piezoelectric transducer 10 has a top surface 35, and a bottom surface 36.

The piezoelectric transducer 10 usually ranges in diameter from about 0.25 inches to about 2.5 inches, the preferred size being less than about 2 inches, and the most preferred being in the range of about ¾ of an inch to about 1⅛ inches. The preferred thickness of the piezoelectric transducers 10 is in the range of about 0.008 millimeters to 0.20 millimeters, and the most preferred range is about 0.01 to 0.05 millimeters, and especially preferred for this invention is a range of about 0.01 to about 0.03 millimeters. The piezoelectric transducers 10 useful in this invention are commercially available, and are manufactured typically from stainless steel, ceramic, brass, and polymeric films, the preferred piezoelectric transducers 10 being stainless steel, and polymeric films, and especially preferred for overall performance is stainless steel. Thin 2-layer transducers are the most versatile configuration of all. They may be used like single sheets (made up of 2 layers), they can be used to bend, or they can be used to extend. A 2-layer transducer produces curvature when one layer expands while the other layer contracts. These transducers are often referred to as benders, bimorphs, or flexural elements. "Benders" achieve large deflections relative to other piezo transducers.

FIG. 2 is a cross sectional view of the piezoelectric transducer assembly 1 of FIG. 1, through the line A—A, exclusive of the wire leads and the piezoelectric transducer 10, which is shown at least in FIG. 4, and FIG. 4 shows the interior of the piezoelectric transducer assembly 1. The insertable transducer retainer assembly 2 is described as insertable, because the transducer retainer assembly 2 is capable of being inserted into the opening 21 of the receiving transducer retainer assembly 11.

The insertable transducer retainer assembly 2 is comprised of fastening means 12, which as shown is a set of threads, but the fastening of the insertable transducer retainer assembly 2 and the receiving transducer retainer assembly 11 can be achieved by any means in which the two segments are securely coupled together during use, but which can be separable for examination, replacement, or repair. For example, a tacky gel or adhesive can be applied to the outside surface 4 of the insertable transducer retainer assembly 2, which would hold the two segments together, but would allow the two segments to be separated easily by hand, or the two segments could be bolted, pinned, or screwed together. The manner and means of fastening the two segments is not critical as long as the two segments stay together during operation, and are separable by a simple means.

With regard to FIG. 3, there is shown in the interior of the insertable transducer retainer assembly 2 a first circular opening 13, which is located in the front 5 of the insertable transducer retainer assembly 2. There is a second opening 16 in the middle of the insertable transducer retainer assembly 2, just under the first circular opening 13. The second opening 16 has a lesser diameter than the diameter of the first circular opening 13 in order to provide a shelf 14 for supporting the piezoelectric transducer 10 in the insertable transducer retainer assembly 2. Also, the second opening 16 is deeper than the first circular opening 13 in order to accommodate a compressible material when desired, which will be described in detail infra, and also, when desired, to provide a housing for any electronic configuration that is desired for the operation of the piezoelectric transducer 10.

In addition to the openings 13 and 16, there is the opening or channel 8, which opens from the second opening 16, through its bottom 17, through the hub 7, and exits from the back 9 of the hub 7. Any wire leads used in the transducer assembly, are passed through this opening 17 to be attached to a computer controlled transducer used for receiving the information from the piezoelectric transducer 10, or the electronic configuration 15.

The openings 13, 16, and 8, along with the shelf 14 can be further appreciated by viewing FIG. 3, which is a full front end view of the insertable transducer retainer assembly 2 of this invention. There is shown the housing 3, the first circular opening 13, the second opening 16, the opening 8 and the shelf 14 provided by the differences in the respective diameters of the openings 13 and 16.

The front outside surface 18, of the housing 3, is beveled. It should be noted that the receiving transducer retainer assembly 11 has a complimentary beveled surface 20 at the bottom 19 of the opening 21, which mates with the beveled surface 18 of the insertable transducer retainer assembly 2. This arrangement allows for the two segments, i.e. the insertable transducer retainer assembly 2 and the receiving transducer retainer assembly 11 to provide a sealed interior when they are coupled together. The integrity of the sealed interior is dependent to some extent on the type of materials being used to manufacture the piezoelectric transducer assembly 1, wherein some materials, because of their inherent compressibility or flexibility provide a good seal at this location, but some materials do not provide these attributes, and therefore, it is contemplated within the scope of this invention in the alternative or in combination, to utilize a gasket at this juncture to provide the sealing needed. Such gaskets are known by those skilled in the art and can consist of O-rings, for example, and other such types of gasketing which can have circular, rectangular, or other such cross sectional configurations, or, they can be flat.

Turning now to the receiving transducer retainer assembly 11, as it can be observed from FIG. 2, there is shown such an assembly 11, wherein there is an opening 29 in the front 28 of the housing 27.

Shown in the opening 29 is the beveled surface 20 in the bottom 19 of the opening 29 and on the interior of the opening 29 of the receiving transducer retainer assembly 11 are the mating threads 22 for the fastening means 12 of the insertable transducer retainer assembly 2. Also shown is a centered opening 23 through the bottom 19 into a hub 24. The hub 24 is centered on the back 25 of the receiving transducer retainer assembly 11 and as shown, is configured with a hexagonal outer surface 26, such that the piezoelectric transducer assembly 1 can be fitted to an exhaust port of a gas pump (gas pump not shown) and conveniently turned much like a threaded nut. The centered opening 23 allows for the exhaust stream from a gas pump to move into the opening 29, and impact the piezoelectric transducer 10, or any of certain disks that surmount the piezoelectric transducer 10 to provide the pulse that is needed to monitor the exhaust gas stream from the gas pump.

Note should be taken of the saucer-shaped depression 30 in the center of the bottom of the opening 29. The saucer-shaped depression 30 has a surface area at the top of the saucer-shaped depression 30 which is relative to the surface area of the top of the piezoelectric transducer 10, said surface area relationship having a ratio in the range of from zero to 1:1, the ratio actually used being dependent on the type of piezoelectric transducer 10 being used, the number and/or the thickness of the stiffening disks 33 being used, the type of stiffening disks 33 used, the use of an adhesive tape, and the size of the piezoelectric transducer 10 being used, all of which will be discussed in detail infra. The saucer-shaped depression 30 is a gas expansion chamber, which essentially allows the diffusion of the incoming exhaust gas stream across the top surface 35 of the piezoelectric transducer 10, or any disk or disks, or adhesive tape, surmounting the piezoelectric transducer 10. Thus, there is an importance to providing the proper surface area ratio between the top of the saucer-like depression and the top of the piezoelectric transducer 10, because if the pulse provided by the exhaust gas from the gas pump is not properly distributed, the response characteristics of the piezoelectric transducer 10 are diminished.

The first embodiment of this invention is a piezoelectric transducer assembly 1 wherein FIG. 4 shows only the insertable transducer retainer assembly 2 in a cross sectional full side view from FIG. 2. The insertable transducer retainer assembly 2 is shown with a disk-like piezoelectric transducer 10, with electrical leads 31 and second opening 16. FIG. 4 is illustrated such that the piezoelectric transducer 10 is not setting on the shelf 14, but is suspended above it. This illustration is for clarity sake only, and it is intended that when the transducer is fully assembled, the piezoelectric transducer 10 is fully seated in the first opening 13 and fully supported by the shelf 14 as is shown in FIG. 5. This embodiment of the transducer can be used when the piezoelectric transducer 10 does not need to be protected, that is, this transducer can be used in those cases where the transducer 10 does not need to be protected from harsh materials and where low pressure gas is being used to drive the gas pump.

For purposes of this invention, "low pressure" means in the range of over zero to about 10 psi. Also for purposes of this invention, "medium pressure" means in the range in excess of 10 to about 20 psi and "high pressure" means in excess of about 20 to about 100 psi. It should be noted that in this embodiment, the opening 16 is devoid of any backing material for the piezoelectric transducer 10, and there is only gas beneath the transducer 10. FIG. 5, shows a cross sectional full side view of the insertable transducer retainer assembly 2 of FIG. 2, there is shown the insertable transducer retainer assembly 2 with the piezoelectric transducer 10 in place in the first opening 13, along with the electrical lead wires 31. Again, in this embodiment, the opening 16 does not have any backing in it except gas, such as air, nitrogen, or carbon dioxide.

Turning to FIG. 6, there is shown a cross sectional full side view of the insertable transducer retainer assembly 2 of FIG. 2, wherein there is shown the embodiment of FIG. 5, but there is in place, in addition, a protective covering 32, which protective covering 32 lies over the piezoelectric transducer 10 and protects the piezoelectric transducer 10 from harsh chemicals and the like that may be carried by the exhaust gas stream coming in from the receiving transducer retainer assembly 11 openings. These protective coverings 32 are manufactured from chemical resistant materials, such as Teflon® or similar materials (Teflon® is a registered trademark of the DuPont Chemical Co., Wilmington, Del., USA for products manufactured from polytetrafluoroethylene). For example, similar materials that could also be used are polyethylene, polypropylene or the like, depending on the environment that the piezoelectric transducer assembly 1 is being used in. It should be noted that the protective covering 32 has a larger diameter than the piezoelectric transducer 10, and the reason for that is that it is required that the protective covering 32 cover the transducer 10 completely, and it is also a requirement of this invention that the protective cover 32 is retained by, and sealed at, the beveled surfaces 18 and 20 when the piezoelectric transducer assembly 1 comes together. When a protective cover 32 is used in the piezoelectric transducer assembly 1, it is believed that there is no requirement for gasketing at the interface of the beveled surfaces 18 and 20. This embodiment is used when there is a need to protect the piezoelectric transducer 10 in applications where low exhaust gas pressures are being used.

Figure 7:
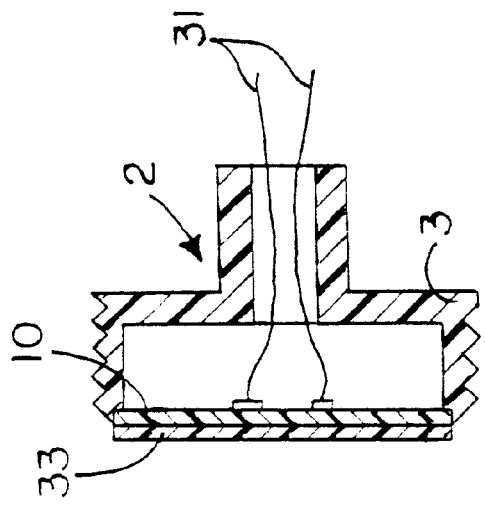
FIG. 7 is a cross sectional full side view of the insertable transducer retainer of this invention taken through line B—B of FIG. 1, showing a stiffener disk surmounting the piezoelectric transducer.

Turning now to another embodiment of this invention, which is a critical concept for this invention, there is shown in FIG. 7, which is a cross sectional full side view of the insertable transducer retainer assembly 2 of FIG. 2, a piezoelectric transducer 10, lying on the shelf 14, and the piezoelectric transducer 10 is surmounted by a stiffening disk 33. Note that the stiffening disk 33 has a diameter approximating or nearly approximating the diameter of the piezoelectric transducer 10 such that the piezoelectric transducer 10 is sealed from the exhaust gas stream. The disk is required to have limited movement at the center of the piezoelectric transducer 10 after the piezoelectric transducer assembly 1 is assembled. In addition to the sealing function, the disk serves as a "stiffener" for the piezoelectric transducer 10 so that it will not permanently bend out of its flat configuration, but moreover, the stiffener disk 33 serves to diminish the return response of the piezoelectric transducer 10 after it flexes in response to positive force placed on it from the exhaust gas stream. In other words, the stiffening disk 33 creates a buffer to diminish the force acting on the piezoelectric transducer 10, from any force that deflects it into the opening 16. It is contemplated within the scope of this invention to use only one disk 33, wherein the disk 33 can also be manufactured from a protective material such as Teflon, and also serve as a stiffener disk 33.

It is contemplated within the scope of this invention to use stiffening disks 33 having thicknesses in the range of about 0.01 millimeters (0.005 inches) to about 1.2 millimeters (0.050 inches), and it is preferred that the thickness be in the range of about 0.127 millimeters (0.010 inches) to about 1.016 millimeters (0.040 inches), and it is especially preferred that the thickness be in the range of about 0.254 millimeters (0.10 inches) to 0.508 millimeters (0.020 inches), all of the above depending on the type of material used to manufacture the disk 33, and the number of such disks 33 used in the piezoelectric transducer assembly 1, and the end use application of the gas pump that the piezoelectric transducer assembly 1 is associated with.

It is also contemplated within the scope of this invention to use more than one stiffening disk 33 and that stiffening disks 33 of various types of materials in a variable stacking configurations can be used herein to accommodate operating conditions or other characteristics of the piezoelectric transducer 10 for different applications. The disks are preferably manufactured from polymeric materials, for example, polyethylene, polypropylene, polytetraflurocarbons, such as polytetrafluroethylene, and the like. These materials typically have Tensile Modulus according to ASTM D638 in the range of 130,000 to 250,000 psi for the polypropylene, 25,000 to 130,000 psi for polyethylene, and in the range of 38,000 to about 110,000 psi for the fluorinated polymers. Fluorinated polymers can be selected from materials such as polytetrafluoroethylene, fluorinated- ethylenepropylene, perfluoroalkoxys, polychlorotrifluoroethylene, ethylene tetrafluoroethylene, and polyvinylidene fluoride, as long as the material is a solid. Especially preferred are polyethylene, polypropylene, and polytetrafluoroethylene. It is contemplated within the scope of this invention to use silicone polymers having similar Tensile Modulii in the range of 50,000 to 80,000, as well.

The number of, the type of, and the total thickness of the stiffening disk or disks 33 to be used can be determined from a simple test in which the stiffening disks 33 are placed in a piezoelectric transducer assembly 1, operably attaching the piezoelectric transducer assembly 1 to the exhaust of the particular pump being tested, and running a test in which the pump activity as indicated by the exhaust gas versus the action of the transducer is charted. This embodiment is used when it is not necessary to have protection for the piezoelectric transducer 10, but it is desired to use medium to high exhaust gas pressures.

Figure 8:
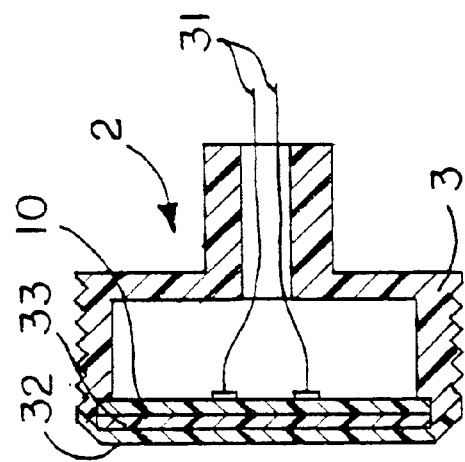
FIG. 8 is a cross sectional full side view of the insertable transducer retainer of this invention taken through line B—B of FIG. 1, showing a stiffener disk surmounting the piezoelectric transducer and a protective covering surmounting the stiffener disk.

In yet another embodiment of this invention, FIG. 8 shows a cross sectional full side view of the insertable transducer retainer assembly 2 of FIG. 2, in which there is additionally shown the piezoelectric transducer 10 in place in the first opening 13 and resting on the shelf 14, the piezoelectric transducer 10 being surmounted by a stiffener disk 33, and then a protective cover 32 covering the stiffener disk 33. This embodiment is desired when the application requires that medium to high exhaust gas pressures are being used, and the environment requires that the piezoelectric transducer 10 be protected.

FIG. 9 shows the embodiment of FIG. 8, except there is shown multiple layers of stiffener disks 33, the reason being that these are used in exhaust gas high pressure applications. The configuration shown in FIG. 9 also shows a protective covering 32, which would be necessary in an environment where the exhaust gas pressures are high and the piezoelectric transducer 10 needs to be protected.

For some medium to high pressure applications, the piezoelectric transducer 10 may need support other than that provided by resting on the shelf 14 and in FIG. 10, there is shown a cross sectional full side view of the insertable transducer retainer assembly 2 of FIG. 2 in which there is shown a compressible material 34 located in the second opening 16. This compressible material 34 is capable of compressing to the extent that the piezoelectric transducer 10 deflects into the opening 16, but does not compress to the extent that the piezoelectric transducer 10 bursts from its position or is pushed from the shelf 14 and into the opening 16. The compressible material allows for a rebound or flex from sustained high pressure applications up to about 100 psi. Typically, this material is an elastomeric or gelled silicone polymer but can be selected from other polymers such as fluoropolymers, urethanes, epoxies, acrylics, polyvinyl alcohols, and polyvinyl acetates, just to name a few. This manner of supporting the piezoelectric transducer 10 prevents destruction of the piezoelectric transducer 10 and helps prevent the piezoelectric transducer assembly 1 from malfunctioning.

Turning to still another embodiment of this invention, which is shown in FIG. 11, there is shown an exploded cross sectional full side view of the piezoelectric transducer assembly 1 of FIG. 1, which has been modified to include an electronic configuration 15 in the opening 16. As shown, the electronic configuration 15 has leads 37 that are attached to a control unit (not shown) for the application in which the piezoelectric transducer assembly 1 is being used. The electronic configuration 15 can be placed anywhere in the opening 16, for example, resting on the bottom 17 of the insertable transducer retainer assembly 2, or it could be suspended by the compressible material 34, as shown in FIG. 12.

For purposes of this invention, the term "compressible" means any elastomeric, gelled, or similar material that will allow the piezoelectric transducer 10 to move into it in direct response to the pulses from the exhaust gas of the gas pump, while preventing the piezoelectric transducer 10 from permanently bending, or bursting, or leaving the support provided by the shelf 14. The compressible material 34 is typically used when the gas pressure on the pump exceeds about 20 psi and up to about 100 psi. Gas pressures below about 20 psi do not normally require the use of the compressible material 34.

Figure 13A:
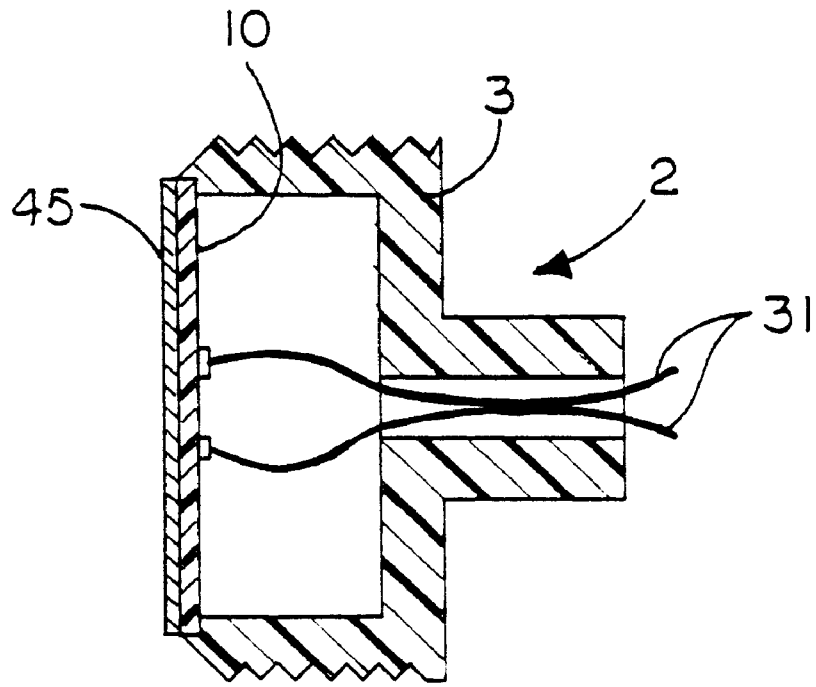
FIG. 13A is a cross sectional full side view of the insertable transducer retainer of this invention taken through line B—B of FIG. 1, showing the use of an adhesive tape layer to cover the piezoelectric transducer.

There is yet another embodiment of this invention which is shown in FIG. 13A in which an adhesive tape 45 surmounts the piezoelectric transducer 10. One purpose for the use of the adhesive tape 45 is to hold the piezoelectric transducer 10 solidly on the shelf 14 and to help diffuse the pulse of the exhaust gas evenly over the piezoelectric transducer 10. For purposes of this invention, the type of adhesive tape 45 is not overly critical, and any adhesive tape 5 that fixes the piezoelectric transducer 10 in place and effectively distributes the effect of the pulse from the exhaust gas evenly over the piezoelectric transducer 10 can be used. One such adhesive tape is Teflon tape of about 3 to 8 mil thickness, with an acrylic adhesive on the back. It should be noted that best results are achieved by making sure that the adhesive tape 45 uniformly rests on and is bonded to the top surface of the piezoelectric transducer 10. As far as the inventor herein can ascertain, any adhesive tape will suffice for this application, as long as it will adhere to the piezoelectric transducer surface and transmit impulses evenly across the piezoelectric transducer surface. If the adhesive tape is not used, the assembly will still tolerate a small gap between the top surface of the piezoelectric transducer 10, and whatever may be the material surmounting the piezoelectric transducer 10.

Figure 13B:
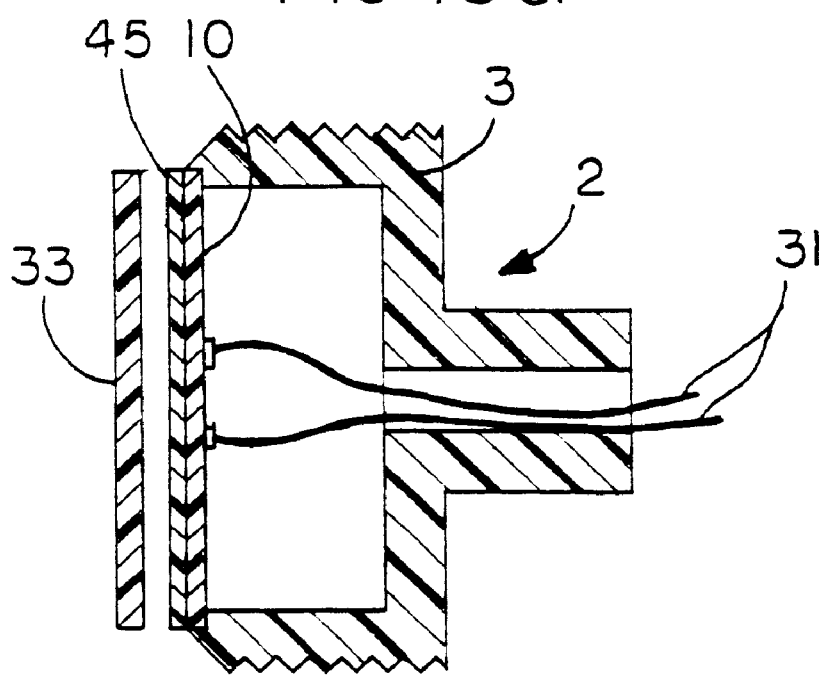
FIG. 13B is a cross sectional full side view of the insertable transducer retainer of this invention from FIG. 13A in which there has been added a stiffener disk 33, shown as exploded from the surface of the adhesive tape layer.
Figure 14:
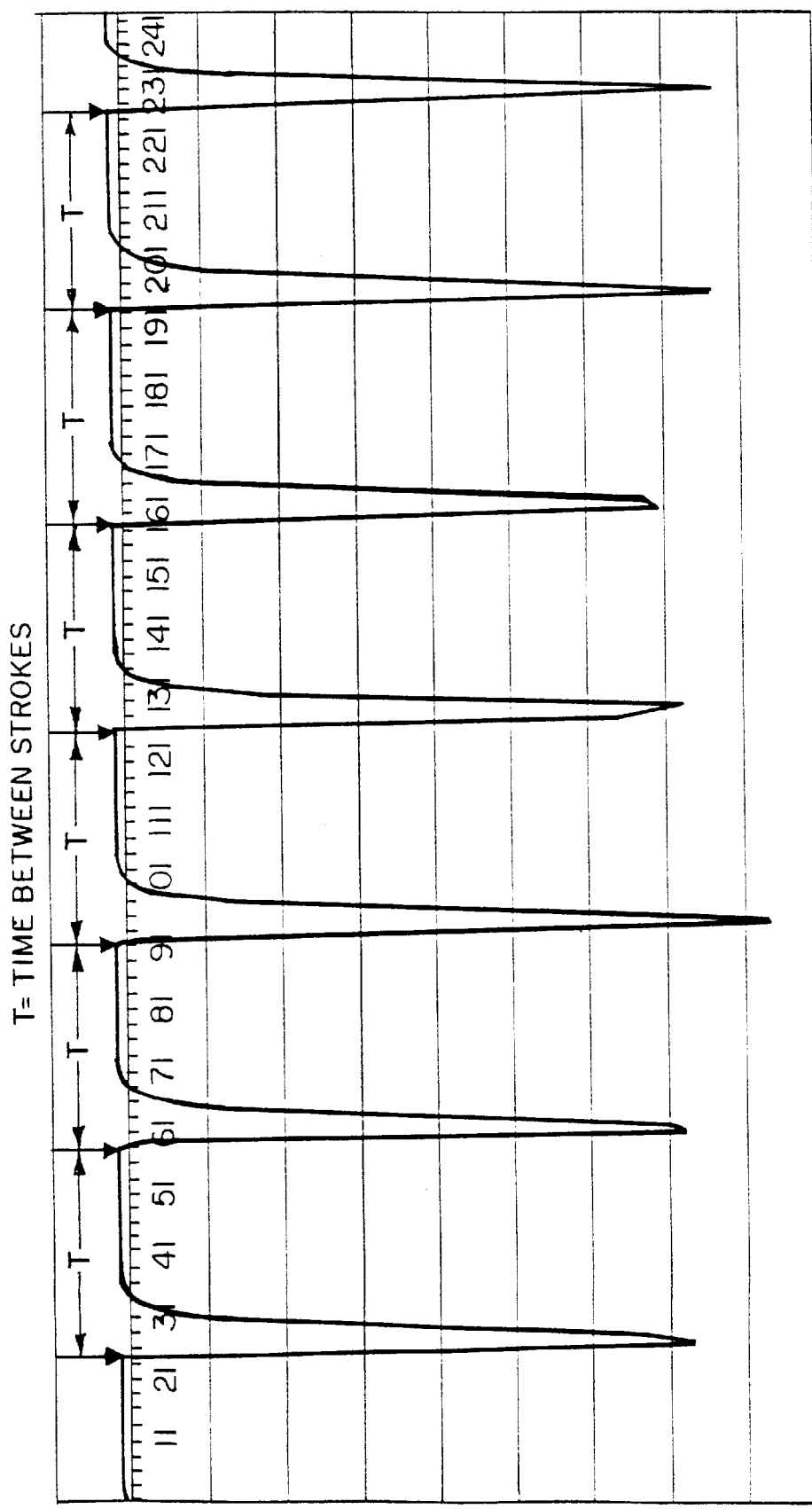
FIG. 14 is a graph showing the measurement of the time elapsed between the exhaust strokes of a gas pump using the piezoelectric transducer of this invention.

In the event that in certain applications, protection is needed for the piezoelectric transducer 10, then one can surmount the adhesive tape 45 with a stiffener disk 33 manufactured from Teflon, or the like, as is shown in FIG. 13B.

The housing parts of the piezoelectric transducer assembly, along with any connectors, and the like, are constructed from any solid material that has sufficient strength to support the internal components. Such materials should be selected on the basis of the end use application that the piezoelectric transducer assembly and the associated pump will be used for, along with the cost of such materials, their handleability, durability, processability and machineability. Such materials can be, for example, polyethylene, polypropylene, polyfluorinated polymers selected from polytetrafluoroethylene, fluorinated ethylenepropylene, perfluoroalkoxys, polychlorotrfluoroethylene, ethylene tetrafluoroethylene and polyvinylidene fluoride, silicone polymers, nylon, synthetic resins, metals selected from aluminum, copper, and alloys of aluminum and copper.

Turning now to another embodiment of this invention, there is a method of monitoring a gas pump, the method comprising two steps, the first step of providing a gas pump that has a piezoelectric transducer assembly operably attached to the exhaust outlet of a gas pump such that the exhaust pulses of the gas pump impact directly or indirectly, the piezoelectric transducer of the piezoelectric transducer assembly and step two, measuring the time elapsed between the exhaust strokes such that the number of strokes per unit of time can be determined. In an analogous method, there is a third step, which is the adjustment of the pump input gas flow to bring the pump into normal working order, based on the measurement of time that has elapsed between the exhaust strokes.

The inventor herein has found one example of connecting a piezoelectric transducer to the exhaust of a pump. However, the pump is not a gas pump, and the transducer assembly 1 of the instant invention was not used therein. The prior art device, as disclosed in U.S. Pat. No. 5,655,357, that issued Aug. 12, 1997, uses a signal to display the progress of a vacuum process and/or shut down the vacuum pump upon establishing a substantial vacuum within the package being evacuated. The transducer assembly 1 of the instant invention detects gas pulses to establish a digital output to a personal computer, for example. The output from the instant transducer assembly 1 is time specific, not pressure specific, as in the prior art device. In addition, by taking the time measurements, i.e., measuring the time elapsed between the exhaust strokes, the number of strokes per unit of time can be determined, and in this manner, it can be determined if the pump is malfunctioning, and if malfunctioning, it can be adjusted, or shut down to prevent damage to the manufacturing or other applications in which it is being used. In general, if the timing between exhaust strokes increases, flow decreases, which might be due to a plugged filter, or changes in gas pressure being fed to the gas pump, or the like. Likewise, if the timing between exhaust strokes decreases, this indicates an increase in flow and problems with pump transducers or line pressure changes to the pump, or the like. By monitoring the number of strokes per unit of time, one can gauge the flow rate of the pump and thereby control the pump.

Turning now to FIG. 17, there is shown a schematic of a gas pump 38, which has attached directly to the gas exhaust 39 of the pump, the piezoelectric transducer assembly 1 of this invention configured as a gas diffuser 40. The gas diffuser 40 can be observed from FIG. 15, wherein there is shown a full side view of the piezoelectric transducer assembly 1 of this invention in a configuration of the gas diffuser 40, showing the exhaust ports 41 for the exhaust gas from the gas pump 38.

Figure 16:
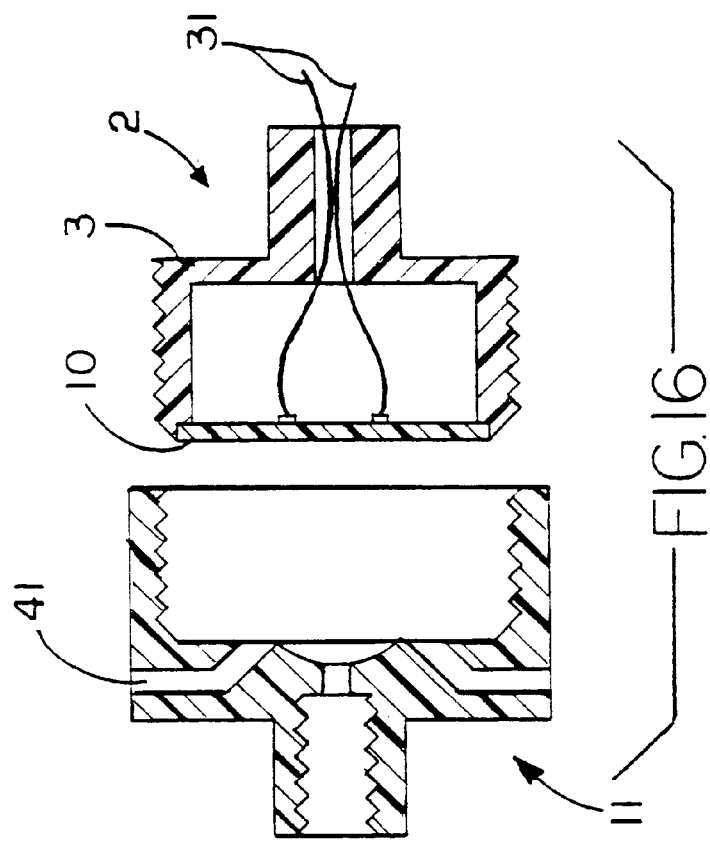
FIG. 16 is a cross sectional side view of the piezoelectric transducer assembly gas diffuser of FIG. 15, showing the interior details of the gas exhaust ports.
Figure 15:
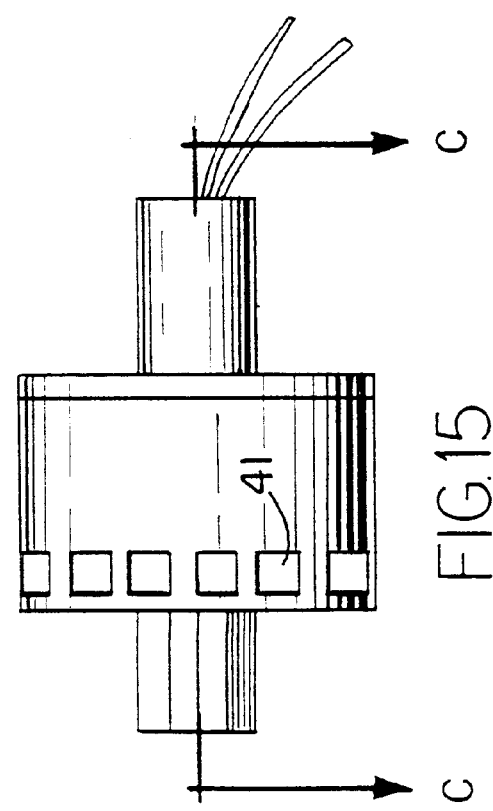
FIG. 15 is a full side view of one piezoelectric transducer assembly gas diffuser.

FIG. 16 shows a cross sectional full side view of the piezoelectric transducer assembly gas diffuser 40 of FIG. 15 through line C—C in which the construction of the exhaust ports 41 in the interior is shown. The placement of the exhaust ports 41 is not critical, as long as the exhaust from the gas pump 38 is allowed to enter the saucer-shaped depression 30, diffuse and impinge on the piezoelectric transducer 10, either directly, or indirectly through stiffener disks 33 and/or protective coverings 32, and/or adhesive tapes 45, and then allowed to exit the receiving transducer retainer assembly 11 without exhausting through the insertable transducer retainer assembly 2. In this manner, the gas diffuser 40 can exhaust the exhaust gas, while maintaining the integrity of the piezoelectric transducer 10. This manner of exhausting the gas from the gas pump 38 does not severely impact the operation of the piezoelectric transducer assembly 1. FIG. 17 also shows a gas inlet 42 to the pump 38.

The piezoelectric transducer assemblies 1 of this invention can also be hooked operably to the pump indirectly, such as is shown in FIG. 18, wherein there is shown the pump 38, in schematic, the gas inlet port 42, the pump gas exhaust line 39, and a gas diffuser 43 for the pump gas exhaust line 39. There is also shown the placement of a piezoelectric transducer assembly 11, without the capability of exhausting gas pump exhaust through it, which is attached to the pump gas exhaust line 39.

The indirect configuration shown in FIG. 18 is useful when it is desired to dislocate the piezoelectric transducer assembly 1 from the direct hook up with the pump 38. In this manner, gas line 44, leading from the pump gas exhaust line to the piezoelectric transducer assembly 11 can be a long line, and thus the piezoelectric transducer 10 can be dislocated a long distance from the pump 38 and the operations of the manufacturing to which the pump 38 is an accessory.

What is claimed is:

1. A piezoelectric transducer assembly comprising:
   an insertable transducer retainer assembly comprising a housing having an outside surface, a front and a back, said back having centered therein, a hub, said centered hub having a centered opening therethrough and said centered hub being integrally connected to said retainer assembly, said outside surface having a fastening means thereon and a tapered front outside circumferential edge;

said insertable transducer retainer assembly having a first circular opening in the front, said first circular opening having a circular piezoelectric transducer disposed therein; said piezoelectric transducer having a bottom surface and a top surface, said piezoelectric transducer having electrical leads connected to the bottom surface thereof;

a second opening in the front, deeper than the first circular opening and having a lesser diameter than the diameter of the first circular opening; the centered opening in the centered hub continuing on through the transducer retainer assembly housing and opening into the second opening to provide a continuous channel through the transducer retainer assembly that exits at the hub;

a receiving transducer retainer assembly comprising a housing, said receiving transducer retainer assembly housing having a front and a back, the back having centered therein a hub integrally mounted thereon, said receiving transducer retainer hub having a back and a front and being lesser in diameter than the diameter of the receiving transducer retainer assembly housing, the front of said receiving transducer retainer assembly having located therein an opening, said receiving transducer retainer assembly opening having an interior surface and a bottom; the interior surface having disposed thereon, fastening means compatible with the fastening means of the insertable transducer retainer assembly, said opening having a tapered circumferential edge at the bottom;

a saucer-like depression below the bottom of the opening in the receiving transducer retainer assembly, said saucer-like depression having a bottom, the surface area of the top of the saucer-like depression being relative to the surface area of the top of the piezoelectric transducer, said surface area relationship having a ratio in the range of from zero to 1:1;

a channeled opening from the bottom of the saucer-like depression through the center of the receiving transducer retainer hub, the interior of the receiving transducer retainer hub having an adapting means for adapting the receiving transducer retainer assembly to a pump, said pump being a gas pump.

2. The piezoelectric transducer assembly as claimed in claim 1 in which there is also present, at least one protective disk surmounting the piezoelectric transducer.

3. The piezoelectric transducer assembly as claimed in claim 2 in which there is additionally present a compressible material in the second opening.

4. The piezoelectric transducer assembly as claimed in claim 3 wherein the compressible material is selected from a group consisting essentially of:
   (i) silicone polymer,
   (ii) urethane polymer,
   (iii) epoxy polymer,
   (iv) acrylic polymer,
   (v) fluoropolymers,
   (vi) polyvinyl alcohol polymer, and
   (vii) polyvinyl acetate polymer.

5. The piezoelectric transducer assembly as claimed in claim 1 in which there is also present at least one stiffener disk surmounting the piezoelectric transducer.

6. The piezoelectric transducer assembly as claimed in claim 5 wherein the stiffener disk is surmounted by a protective disk.

7. The piezoelectric transducer assembly as claimed in claim 5 in which there is additionally present a compressible material in the second opening.

8. The piezoelectric transducer assembly as claimed in claim 7 wherein the compressible material is selected from a group consisting essentially of:
   (i) silicone polymer,
   (ii) urethane polymer,
   (iii) epoxy polymer,
   (iv) acrylic polymer,
   (v) fluoropolymers,
   (vi) polyvinyl alcohol polymer, and
   (vii) polyvinyl acetate polymer.

9. The piezoelectric transducer assembly as claimed in claim 1 in which there is also present an adhesive tape surmounting the piezoelectric transducer.

10. The piezoelectric transducer assembly as claimed in claim 9 wherein the adhesive tape is surmounted by a protective disk.

11. The piezoelectric transducer assembly as claimed in claim 9 in which there is additionally present a compressible material in the second opening.

12. The piezoelectric transducer assembly as claimed in claim 11 wherein the compressible material is selected from a group consisting essentially of:
   (i) silicone polymer,
   (ii) urethane polymer,
   (iii) epoxy polymer,
   (iv) acrylic polymer,
   (v) fluoropolymers,
   (vi) polyvinyl alcohol polymer, and
   (vii) polyvinyl acetate polymer.

13. The piezoelectric transducer assembly as claimed in claim 9 in which there is additionally present a compressible material in the second opening.

14. The piezoelectric transducer assembly as claimed in claim 15 wherein the compressible material is selected from a group consisting essentially of:
   (i) silicone polymer,
   (ii) urethane polymer,
   (iii) epoxy polymer,
   (iv) acrylic polymer,
   (v) fluoropolymers,
   (vi) polyvinyl alcohol polymer, and
   (vii) polyvinyl acetate polymer.

15. The piezoelectric transducer assembly as claimed in claim 1 in which there is additionally present a compressible material in the second opening.

16. The piezoelectric transducer assembly as claimed in claim 15 wherein the compressible material is selected from a group consisting essentially of:
   (i) silicone polymer,
   (ii) urethane polymer,
   (iii) epoxy polymer,
   (iv) acrylic polymer,
   (v) fluoropolymers,
   (vi) polyvinyl alcohol polymer, and
   (vii) polyvinyl acetate polymer.

17. The piezoelectric transducer assembly as claimed in claim 1 in which there is additionally present a compressible material in the second opening, a stiffener disk surmounting the piezoelectric transducer, a protective cover surmounting the stiffener disk.

18. The piezoelectric transducer assembly as claimed in claim 1 in which there is additionally present a compressible material in the second opening, an adhesive tape surmounting the piezoelectric transducer, a stiffener disk surmounting the adhesive.

19. The piezoelectric transducer assembly as claimed in claim 1 in which there is additionally present a compressible material in the second opening, an adhesive tape surmounting the piezoelectric transducer, a stiffener disk surmounting the adhesive tape, a protective cover surmounting the stiffener disk.

20. The piezoelectric transducer assembly as claimed in claim 1 wherein the piezoelectric transducer is manufactured from a material selected from a group consisting essentially of:
   (i) stainless steel,
   (ii) ceramic,
   (iii) brass, and
   (iv) plastic film.

21. The piezoelectric transducer assembly as claimed in claim 1 wherein the insertable transducer retainer assembly and the receiving transducer retainer assembly are manufactured from a solid material.

22. The piezoelectric transducer assembly as claimed in claim 21 wherein the solid material is selected from the group consisting essentially of:
   i. polyethylene
   ii. polypropylene,
   iii. fluorinated polymers selected from:
      a. polytetrafluoroethylene,
      b. fluorinated ethylenepropylene,
      c. perfluoroalkoxys copolymers,
      d. polychlorotrifluoroethylene,
      e. ethylene tetrafluoroethylene, and,
      f. polyvinylidene fluoride,
   iv. silicone polymers,
   v. nylon,
   vi. synthetic resins,
   vii. metals selected from:
      a. aluminum,
      b. copper, and,
      c. alloys of aluminum and copper.

23. The piezoelectric transducer assembly as claimed in claim 22 wherein the solid material is a regulatory agency approved or compliant material, wherein the regulatory agency is selected from the group consisting essentially of:
   A. United States Food and Drug Administration,
   B. United States Department of Agriculture,
   C. Canada AG,
   D. National Sanitation Foundation, and
   E. 3A Dairy.

24. The piezoelectric transducer assembly as claimed in claim 22 wherein the solid material is polytetrafluoroethylene.

25. The piezoelectric transducer assembly as claimed in claim 1 wherein the insertable transducer retainer assembly and the receiving transducer retainer assembly are manufactured from solid polypropylene.

26. The piezoelectric transducer assembly as claimed in claim 1 that is configured as a gas diffuser for a gas pump.

27. In combination, a gas pump and a piezoelectric transducer assembly as claimed in claim 1, wherein the gas pump and the piezoelectric transducer assembly are operably connected to allow the monitoring of the gas pump.

28. A system for monitoring a gas pump, the system comprising in combination:
   (i) a gas pump,
   (ii) a piezoelectric transducer assembly as claimed in claim 1, and
   (iii) a control system for the combination.

29. A manufacturing operation in which at least one system as claimed in claim 28 is used.

30. A manufacturing operation as claimed in claim 29 in which sulfuric acid is used.

31. A manufacturing operation as claimed in claim 29 in which hydrochloric acid is used.

32. A manufacturing operation as claimed in claim 29 in which nitric acid is used.

33. A manufacturing operation as claimed in claim 29 in which caustic is used.

34. A manufacturing operation as claimed in claim 29 in which food is processed.

35. A manufacturing operation as claimed in claim 29 in which food is manufactured.

36. A piezoelectric transducer assembly comprising:
   an insertable transducer retainer assembly comprising a housing having an outside surface, a front and a back, said back having centered therein, a hub, said centered hub having a centered opening therethrough and said centered hub being integrally connected to said retainer assembly, said outside surface having a fastening means thereon and a tapered front outside circumferential edge;
   said insertable transducer retainer assembly having a first circular opening in the front, said first circular opening having a circular piezoelectric transducer disposed therein; said piezoelectric transducer having a bottom surface and a top surface;
   a second opening in the front, deeper than the first circular opening, having a lesser diameter than the diameter of the first circular opening, said second opening having a bottom, the centered opening in the centered hub continuing on through the transducer retainer assembly housing and opening into the second opening to provide a continuous channel through the transducer retainer assembly that exits at the hub, said second opening having an electronic configuration disposed therein, said piezoelectric transducer having first electrical leads with distal and near ends, said first electrical leads being connected to the bottom surface of the piezoelectric transducer at the distal ends thereof, said first electrical leads being electrically connected at the near ends to the electronic configuration;
   a second set of electrical leads electrically connected to the electronic configuration and passing through said continuous channel;
   a receiving transducer retainer assembly comprising a housing, said receiving transducer retainer assembly housing having a front and a back, the back having centered therein a hub integrally mounted thereon, said receiving transducer retainer hub having a back and a front and being lesser in diameter than the diameter of the receiving transducer retainer assembly housing, the front of said receiving transducer retainer assembly having located therein an opening, said receiving transducer retainer assembly opening having an interior surface and a bottom; the interior surface having disposed thereon, fastening means compatible with the fastening means of the insertable transducer retainer assembly, said opening having a tapered circumferential edge at the bottom;

a saucer-like depression below the bottom of the opening in the receiving transducer retainer assembly, said saucer-like depression having a bottom, the surface area of the top of the saucer-like depression being relative to the surface area of the top of the piezoelectric transducer, said surface area relationship having a ratio in the range of from zero to 1:1;

a channeled opening from the bottom of the saucer-like depression through the center of the receiving transducer retainer hub, the interior of the receiving transducer retainer hub having an adapting means for adapting the receiving transducer retainer assembly to a pump, said pump being a gas pump.

37. The piezoelectric transducer assembly as claimed in claim 36 in which there is also present, at least one protective disk surmounting the piezoelectric transducer.

38. The piezoelectric transducer assembly as claimed in claim 37 in which there is additionally present a compressible material in the second opening.

39. The piezoelectric transducer assembly as claimed in claim 36 in which there is also present at least one stiffener disk surmounting the piezoelectric transducer.

40. The piezoelectric transducer assembly as claimed in claim 39 wherein the stiffener disk is surmounted by a protective disk.

41. The piezoelectric transducer assembly as claimed in claim 40 in which there is additionally present a compressible material in the second opening.

42. The piezoelectric transducer assembly as claimed in claim 39 in which there is additionally present a compressible material in the second opening.

43. The piezoelectric transducer assembly as claimed in claim 36 in which there is additionally present a compressible material in the second opening.

44. The piezoelectric transducer assembly as claimed in claim 36 wherein the piezoelectric transducer is manufactured from a material selected from a group consisting essentially of:
  (i) stainless steel,
  (ii) ceramic,
  (iii) brass, and
  (iv) plastic film.

45. The piezoelectric transducer assembly as claimed in claim 36 wherein the insertable transducer retainer assembly and the receiving transducer retainer assembly are manufactured from solid polytetrafluroethylene.

46. The piezoelectric transducer assembly as claimed in claim 36 wherein the insertable transducer retainer assembly and the receiving transducer retainer assembly are manufactured from solid polypropylene.

47. In combination, a gas pump and a piezoelectric transducer assembly as claimed in claim 36, wherein the gas pump and the piezoelectric transducer assembly are operably connected to allow the monitoring of the gas pump.

48. A system for monitoring a gas pump, the system comprising in combination:
  (i) a gas pump,
  (ii) a piezoelectric transducer assembly as claimed in claim 36, and
  (iii) a control system for the combination.

49. A manufacturing operation in which at least one system as claimed in claim 48 is used.

* * * * *